(12) United States Patent
van Wijk et al.

(10) Patent No.: US 11,744,039 B2
(45) Date of Patent: Aug. 29, 2023

(54) SYSTEM AND METHOD FOR TRANSFERRING THERMAL ENERGY FROM INTEGRATED CIRCUITS

(71) Applicant: JDi Design Inc., Vancouver (CA)

(72) Inventors: Adrian Albert van Wijk, Vancouver (CA); Nikolas Lyman Henderson Radosevic, Vancouver (CA)

(73) Assignee: JDI Design Inc., Vancouver (CA)

( * ) Notice: Subject to any disclaimer, the term of this patent is extended or adjusted under 35 U.S.C. 154(b) by 0 days.

(21) Appl. No.: 17/462,815

(22) Filed: Aug. 31, 2021

(65) Prior Publication Data
US 2022/0394880 A1  Dec. 8, 2022

Related U.S. Application Data

(60) Provisional application No. 63/075,037, filed on Sep. 4, 2020.

(51) Int. Cl.
*H05K 7/20* (2006.01)
*F24D 11/00* (2022.01)

(52) U.S. Cl.
CPC ....... *H05K 7/20272* (2013.01); *F24D 11/005* (2013.01); *F24D 2200/29* (2013.01)

(58) Field of Classification Search
CPC ............... H05K 7/20272; F24D 11/005; F24D 2200/29; H01L 23/3107; H01L 23/427; H01L 23/473; F24F 11/83
See application file for complete search history.

(56) References Cited

U.S. PATENT DOCUMENTS 3,586,101 A * 6/1971 Chu ...................... F25B 23/006
174/15.1
5,406,807 A * 4/1995 Ashiwake ............. H01L 23/427
361/699

(Continued)

FOREIGN PATENT DOCUMENTS

EP         2253893 A2 * 11/2010  ............. F01K 13/02
FR         3015645 A1 *  6/2015  ........... F24D 17/001

(Continued)

OTHER PUBLICATIONS

DE4035115, Nov. 19, 1997.*

*Primary Examiner* — Frantz F Jules
*Assistant Examiner* — Martha Tadesse
(74) *Attorney, Agent, or Firm* — Seed Intellectual Property Law Group LLP

(57) ABSTRACT

There is disclosed a system and method for transferring waste heat from integrated circuits. In an embodiment, the system comprises: a self-contained enclosure having integrated circuits therein, the self-contained enclosure further including: a first fluid circuit configured for removing waste heat from the integrated circuits; an inlet for connection from an external water tank and an outlet for connection to the external water tank, that when connected with the external water tank forms a second fluid circuit; a heat exchanger operatively connected to the first fluid circuit and the second fluid circuit, and configured to transfer thermal energy therebetween; and a control for regulating a temperature gradient and a flow rate in each of the first and second fluid circuits, such that both a desired integrated circuit operating temperature and a desired water tank temperature is achieved. A plurality of self-contained enclosures co-located with water tanks may form nodes of a distributed computing and heating network.

22 Claims, 4 Drawing Sheets

(56) References Cited

U.S. PATENT DOCUMENTS

| | | | |
|---|---|---|---|
| 8,548,640 B2 | 10/2013 | Belady et al. | |
| 10,206,308 B2 | 2/2019 | De Meijer et al. | |
| 2006/0005554 A1* | 1/2006 | Okada | F25D 17/02 |
| | | | 62/186 |
| 2006/0152238 A1 | 7/2006 | Beaman et al. | |
| 2010/0083950 A1 | 4/2010 | Bloxam | |
| 2011/0082601 A1* | 4/2011 | Pulley | F24D 19/1009 |
| | | | 237/2 A |
| 2012/0331433 A1* | 12/2012 | Brunschwiler | H01L 25/0657 |
| | | | 716/110 |
| 2018/0211900 A1 | 7/2018 | Gutala et al. | |
| 2018/0307283 A1* | 10/2018 | Dupont | G06F 1/203 |
| 2019/0338962 A1* | 11/2019 | Minnoy | F24D 17/02 |

FOREIGN PATENT DOCUMENTS

| | | |
|---|---|---|
| GB | 2502310 A | 11/2013 |
| GB | 2567209 A | 4/2019 |

\* cited by examiner

US 11,744,039 B2

SYSTEM AND METHOD FOR TRANSFERRING THERMAL ENERGY FROM INTEGRATED CIRCUITS

CROSS-REFERENCE TO RELATED APPLICATIONS

This application claims the benefit of U.S. Provisional Patent Application No. 63/075,037 filed on Sep. 4, 2020, which is incorporated by reference herein in its entirety.

FIELD OF THE INVENTION

The present disclosure relates generally to dissipating and transferring thermal energy from integrated circuits.

BACKGROUND

Integrated circuits (ICs) used for the processing of digital electronic signals generate heat during operation. This heat is often called reject energy, and if not removed can significantly degrade the ICs or limit their processing capacity. Therefore, to optimize IC performance, reject heat must be dissipated. While various methods exist for dissipating heat from ICs, they generally result in at least some of the dissipated thermal energy being lost to entropy and wasted, for example heat lost to a surrounding environment.

Therefore, to minimize waste energy, a system and method is needed for transferring thermal energy from ICs which addresses at least some of the above limitations.

SUMMARY

The present disclosure relates generally to a system and method for transferring thermal energy from ICs which improves utilization and minimizes wasted thermal energy.

In an aspect, there is provided a system and method for dissipating heat energy from ICs which improves utilization of the heat energy and minimizes wasted energy using fluid circuits to maintain a constant flow of heat energy where there is a variable or decreasing temperature gradient by matching the production of dissipated heat energy with a co-located demand for energy for heating.

In one aspect there is provided a system for transferring heat from integrated circuits, comprising:
integrated circuits enclosed by an enclosure; a heat exchanger; a first fluid circuit in a closed loop with the enclosure and heat exchanger for cooling a first fluid in contact with the integrated circuits;
a second fluid circuit connected to the heat exchanger for heating a second fluid in the second fluid circuit; a temperature sensor for measuring a temperature in the first fluid circuit or second fluid circuit or integrated circuit; fluid flow control means in the second fluid circuit;
a control module operatively connected to receive temperature data from the temperature sensor and generating control signals to the fluid flow control means to regulate the temperature in the first and second fluid circuits.

In a second aspect there is provided a method of installing a heat transfer system comprising the steps: enclosing ICs within an enclosure filled with a first fluid; connecting a first fluid circuit in a closed loop with the enclosure and with a heat exchanger for cooling the first fluid; connecting a second fluid circuit with the heat exchanger and a heated appliance; connecting a temperature sensor to measure a first temperature in the first fluid circuit or second fluid circuit or integrated circuit; connecting a fluid flow control means to the second fluid circuit; and connecting a control module to the temperature sensor and the fluid flow control means, which control module is adapted to generate control signals to the fluid flow control means to regulate the temperature in the first fluid circuit.

More generally, the present system and method addresses this challenge by regulating the transfer of thermal energy dissipated from ICs to co-located appliances having a need for a heating energy source, such as a hot water tank for example. The system utilizes fluid circuits and a plurality of sensors monitored by a control module which generates control signals to regulate a variable temperature gradient and maintain a constant transfer of thermal energy from ICs to a co-located appliance.

In a third aspect there is provided a method for balancing a computer processing workload performed by ICs with a surplus electricity supply from a Power Utility Provider where the available electricity supply exceeds electricity demand as determined by the Power Utility. Provider. The system for transferring heat from ICs may be used as a heat pump to transfer heat to appliance, such as a hot water tank, to be used as a heat storage battery. The electricity used for computational workloads is rejected as heat and may be stored for use at a future time. Advantageously, the present system and method provides a practical solution that can recycle dissipated heat from ICs by minimizing wasted energy, and optimizing utilization of the heat.

In this respect, before explaining at least one embodiment of the invention in detail, it is to be understood that the invention is not limited in its application to the details of construction and to the arrangements of the components set forth in the following description or the examples provided therein, or illustrated in the drawings. Therefore, it will be appreciated that a number of variants and modifications can be made without departing from the teachings of the disclosure as a whole. Therefore, the present system, method and apparatus is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The present system and method will be better understood, and objects of the invention will become apparent, when consideration is given to the following detailed description thereof. Such description makes reference to the annexed drawings, wherein.

Figure 1:
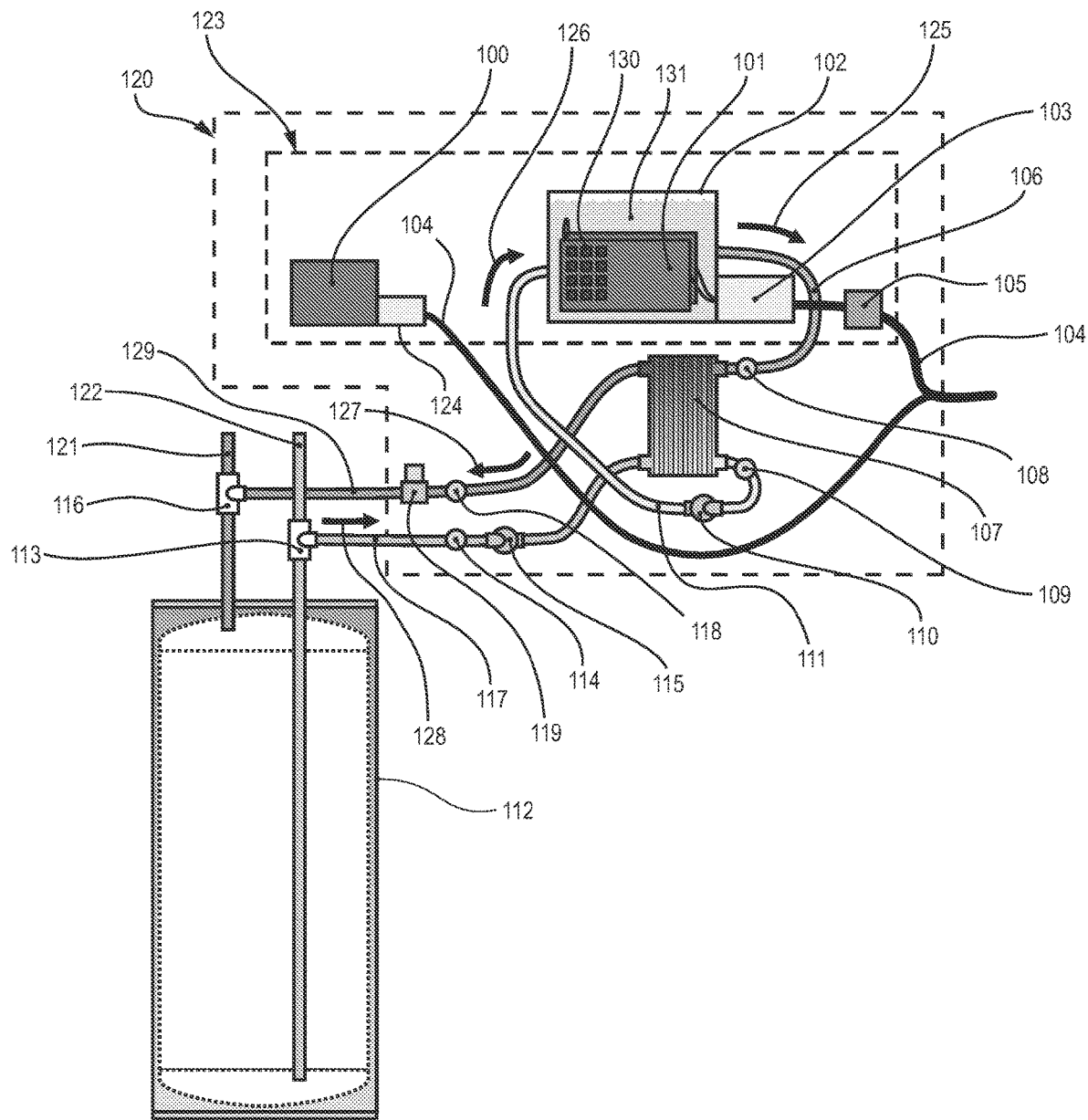
FIG. 1 shows a schematic block diagram of a system in accordance with an illustrative embodiment.

In the drawings, embodiments are illustrated by way of example. It is to be expressly understood that the description and drawings are only for the purpose of illustration and as an aid to understanding, and are not intended as describing the accurate performance and behavior of the embodiments and a definition of the limits of the invention.

DETAILED DESCRIPTION

As noted above, the present disclosure relates to a system and method for dissipating and relocating thermal energy from integrated circuits. With reference to FIG. 1, there is provided integrated circuits (IC) mounted upon a printed circuit board (PCB) connected by first fluid circuit to a heat exchanger, which is further connected by a second fluid circuit to an appliance. Waste heat dissipated by the integrated circuits can be delivered to the appliance for further use. A housing around the integrated circuits contains the ICs submerged in a dielectric cooling fluid. The heat is dissipated from the IC by conduction and forced convection, the first circuit pump circulating fluid and cooling the IC's. Heat from the ICs can be absorbed by the cooling fluid in a number of ways, as illustrated in FIGS. 3-7. A Pump in the first fluid circuit moves the cooling fluid across the integrated circuit towards the heat exchanger. A second pump in the second fluid circuit moves the second fluid through the heat exchanger and circulates it through the appliance. A control module controls the rate of flow of the second fluid circuit via valves or pumps. In another configuration, the controller may also control the first fluid circuit flow.

In an embodiment, the control module maintains control over the transfer of heat from the ICs to the appliance by managing the rate of flow of either the second fluid circuit or both fluid circuits, thus regulating temperature gradients.

In an embodiment, the control module maintains control over the transfer of heat from the ICs to the appliance by controlling the rate of flow of either fluid circuit, and a) the temperature of the appliance or b) the workload on the ICs.

In a preferred embodiment, the system co-locates a source of IC heat energy with an appliance which requires energy for heating, such as a hot water tank. The system utilizes fluid circuits for transferring the heat energy, and a plurality of sensors monitored by a control module to control the temperature gradient for the optimal transfer of heat from the ICs to the appliance.

In an embodiment, the system co-locates a source of IC heat energy with a network of appliances which requires energy for heating that are connected by a distributed network. By simultaneously monitoring the supply and demand for electricity, the periods of low electricity demand or over supply of electricity can be matched to process a workload on the ICs to heat an appliance where the heat is stored to be used later when electricity supply may be constrained.

In an embodiment, the control module maintains control over the transfer of heat from the ICs to the appliance by controlling the rate of flow of the fluids, by simultaneously monitoring the temperature of the appliance and the workload on the ICs.

In an embodiment, the control module provides energy use and temperature data from the co-located ICs heat source and heated appliance for use by the appliance operator.

In an embodiment, the control module provides energy use, energy capacity and temperature data from the heated appliances for use by participants in an associated network.

An illustrative embodiment will now be described with reference to the drawings.

Now referring to FIG. 1, shown is a schematic diagram of a system in accordance with an embodiment. The system's various components are labeled, as follows:

- 100. Control Module
- 101. Integrated Circuit on PCB
- 102. PCB Enclosure
- 103. Power Supply for ICs
- 104. Power Cable
- 105. Relay Switch
- 106. Coolant Pipe (with heated cooling fluid)
- 107. Heat Exchanger
- 108. Temperature Sensor (from ICs)
- 109. Temperature and Flow Sensor (to ICs)
- 110. Exchange Pump
- 111. Coolant Pipe (with cooled cooling fluid)
- 112. Heat Appliance (hot water tank)
- 113. Cold Water Connector
- 114. Temperature and Flow Sensor (from appliance)
- 115. Variable Speed Pump (appliance pump)
- 116. Hot Water Connector
- 117. Pipe (from appliance)
- 118. Temperature Sensor (to appliance)
- 119. Solenoid or adjustable valve (normally open)
- 120. Heat Transfer Unit (enclosure box)
- 121. Existing Plumbing (hot water supply pipe)
- 122. Existing Plumbing (cold water supply pipe)
- 123. Computer
- 124. Power Supply for System Controller & Pumps
- 125. First Fluid Circuit flow direction (heated cooling fluid)
- 126. First Fluid Circuit Flow Direction (cooled cooling fluid)
- 127. Second Fluid Circuit Flow Direction (heat to appliance)
- 128. Second Fluid Circuit Flow Direction (from appliance)
- 129. Pipe (to appliance)
- 130. Integrated Circuit Chip (IC)
- 131. Dielectric Fluid (cooling fluid)

As shown in FIG. 1, multiple integrated circuits on one or more PCBs 101 is located within a PCB enclosure 102. The PCBs are powered by a power supply 103 connected via a power supply cable 104 with a system power relay switch 105.

Still referring to FIG. 1, in an embodiment, the PCB enclosure 102 is operatively connected to a coolant pipe 106 which removes the first working fluid from the PCB enclosure that has absorbed reject heat from the ICs 130. The coolant pipe 106 connects to the top of a heat exchanger 107 to cool the first working fluid as it passes through the heat exchanger. Within the heat exchanger 107, the system utilizes forced convection and conduction to achieve the transfer of heat between the fluid circuits while keeping the fluids separate from each other. By way of example, and not by way of limitation, in an embodiment, the heat exchanger 107 may be a plate heat exchanger which provides an efficient way to transfer heat in fluids. However, it will be appreciated that other types of heat exchangers may also be used with varying efficiency.

In an embodiment, a system Control 100 is operatively connected to a Temperature Sensor 108 monitoring a working fluid from the ICs 130, as well as another Temperature and Flow Sensor 109 monitoring the cooled working fluid going back to the ICs 130. The Control 100 can be further connected to an exchange pump 110 which allows for the first working fluid to circulate via a coolant pipe 111 to be pumped back through the PCB enclosure 102 to absorb and remove more heat.

Still referring to FIG. 1, on the left side of the heat exchanger 107, the system includes a second fluid circuit connected to an appliance which requires a source of heat energy, such as a hot water tank 112, for example. Leading out from the hot water tank 112 is a pipe 117 which is connected to a cold water inlet junction 113. From this cold water inlet 113, cooler water is drawn through a Temperature and Flow Sensor 114, by a variable speed pump 115. The rate of flow is determined by the pump 115 or valve 119 that is set by the controller 100.

As shown, the cool water passes through a pipe 117 which enters the heat exchanger 107, heat from the first working fluid is transferred to the second fluid within the heat exchanger 107. Heated water is returned from the heat exchanger 107 via a Pipe 129 and passes through another Temperature Sensor 118 and a valve 119, which is normally open, on its way back to the water tank 112. The Control module monitors the temperature gradients between any two of the temperature sensors 108, 109, 114 and 118 and adjusts the variable speed pump 115 and/or exchange pump 110 either increasing the flow or decreasing the flow as necessary to maintain a constant transfer of heat energy. In the case where heat is being used by the appliance and insufficient heat is being generated by the ICs determined by a low temperature at 118 or a low temperature at 108 or 109 when the pump 115 is off and a positive flow is measured at 114 the valve 119 is restricted by the System Controller until the temperature at 108 and 109 are sufficient to heat the second fluid to the temperature required by the appliance.

There also exists additional ways in which the flow rate of the second fluid can be adjusted by the control system without depending on a variable speed pump. For example, a) a pump with a constant flow rate can be turned on and off at varying intervals to adjust the total flow rate over time, b) an adjustable flow valve to the fluid circuit can be used in conjunction with a pump with a constant flow rate to reduce flow while the pump is operational, or c) a solenoid valve can turn on and off at varying intervals to adjust the total flow rate over time to reduce flow while the pump is operational.

In an embodiment, the system as illustrated in FIG. 1, may be provided within a self-contained insulated enclosure or box 120, excluding the water tank 112 and the Hot and Cold Water Inlet connectors 116 and 113 shown outside the dashed lines, is provided within a self-contained insulated enclosure or box. The system is thus connected to an appliance, and in this embodiment, the existing plumbing attached to a hot water tank 112 via a cold water inlet 113 from the hot water tank 112 and a hot water outlet 116 back into the hot water tank 112. This ensures that any energy losses to open air are minimized. Furthermore, the closed fluid circuits and the heat exchanger 107 provide a closed heat energy transfer mechanism which further minimizes any heat energy losses between the ICs and the water tank.

The system may be retrofitted to existing plumbing. The hot water out pipe 121 and cold water inlet pipe 122 in the illustration are representative of existing plumbing pipes that are connected to the hot water tank or a heated appliance. In the case this was used for heating an appliance or a radiator heating system it would connect to the existing circulating fluid heating system.

In operation, the cooling fluid within the fluid circuits remains in a liquid state, and does not operate at or above a boiling temperature of either fluid in the fluid circuits at one atmospheric pressure. This allows for a constant volume of working fluid within the system at any given time.

In a preferred embodiment, the system Control is adapted to monitor each of the Temperature Sensors 108, 109, 114 and 118. The system may also monitor the rate of flow in the second fluid circuit or the first fluid circuit and can control the rates at which each of these pumps 115 or 110 pump the fluid. In addition, the system Control can also monitor and control the power supply 103 for the PCBs 101.

The controller may be arranged to monitor the heat energy in the first fluid circuit, i.e. heated fluid in the first fluid circuit from the ICs should be substantially equal to the energy consumed by the integrated circuits. The amount of heat transfer may be determined by a temperature gradient, for example between the inlet 114 on the second fluid circuit and out temperatures 109 to the heat exchanger 107 on the first fluid circuit. The control module may adjust heat transfer rate by increasing or decreasing the flow of the second or both fluid circuits. The heat transferred to the heated appliance is governed by the thermal capacity of the fluid (typically water). The Controller 100 monitors the flow mass rate and change in temperature from sensor 114 to sensor 118 in the second fluid circuit. Knowing the inlet temperature 114, the flow rate, and heat capacity of the fluid a specific temperature can be transferred to the heated appliance. Heat to the appliance can be optimized by the Controller 100 by adjusting the second fluid flow rate to obtain the desired heat transfer rate.

There are several variations of the control algorithm. By measuring the temperature of the IC or the first fluid circuit, the controller can operate in closed-feedback to adjust the flow control of the second fluid circuit to set a constant temperature for the ICs. The second fluid flow rate can be estimated (open control) or operated in closed-feedback by measuring the temperature of the outlet 118 in the second fluid circuit adjusting the second flow control to set constant temperature to the appliance and the ICs.

It is possible to control the fluid circuit flow rates to deliver a constant temperature to an appliance by measuring the input temperature of the second fluid at temperature sensor 114 in conjunction with the total energy used by the PCBs and ICs in watts. By using the input temperature of the second fluid circuit and knowing the amount of energy entering the system in watts, a flow rate can be calculated to transfer only the energy needed to deliver the desired appliance temperature.

In an embodiment, the system Control may operate in an analogous manner to a thermostat in that the system Control will initiate heating of an appliance 112 when the temperature goes below a specified temperature, and turns heating off when the water is heated to a specified temperature. In an embodiment, there is a failsafe (safety switch) that will turn the ICs off.

In one embodiment the ICs mounted to a Printed Circuit Board (PCB) are submerged in a dielectric cooling fluid (first cooling fluid) 131 housed in the PCB enclosure 102. The PCB enclosure is connected via a pipe 106 to the top of the heat exchanger 107 and is located above the heat exchanger 107. The pump 110 is connected to the bottom of the heat exchanges 107 and located below to prevent air bubbles from circulating through the first cooling fluid. By locating the pump at the bottom of the fluid circuit the head pressure of the cooling fluid displaces any gasses in the system with the heavier liquids, thus ensuring the pump is always primed with liquid preventing to it from cavitating or running dry when encountering an air bubble.

To prevent harmful bacteria from growing in a hot water tank, most regulations require hot water tanks to heated to 60 deg C. or 140 deg F. However to reduce scalding and or save energy hot water tanks can be set to heat water to a much lower temperature, circumventing the benefits of the regulations.

In a known manner to fulfill the requirement to heat water to a high temperature and prevent scalding without compromising on the need to kill harmful bacteria a mixing valve at inlet and outlet to the tank is used where the valve is set to introduce cold water when the hot water is used.

The disclosed Heating System when configured to heat an appliance such as a hot water tank can in addition be configured to introduce cooler water to provide a similar function to that of a mixing valve and reducing the temperature of hot water when it is used.

In an embodiment, the flow from exchange pump 110 can be managed by a system controlled by the IC's computer.

Figure 2:
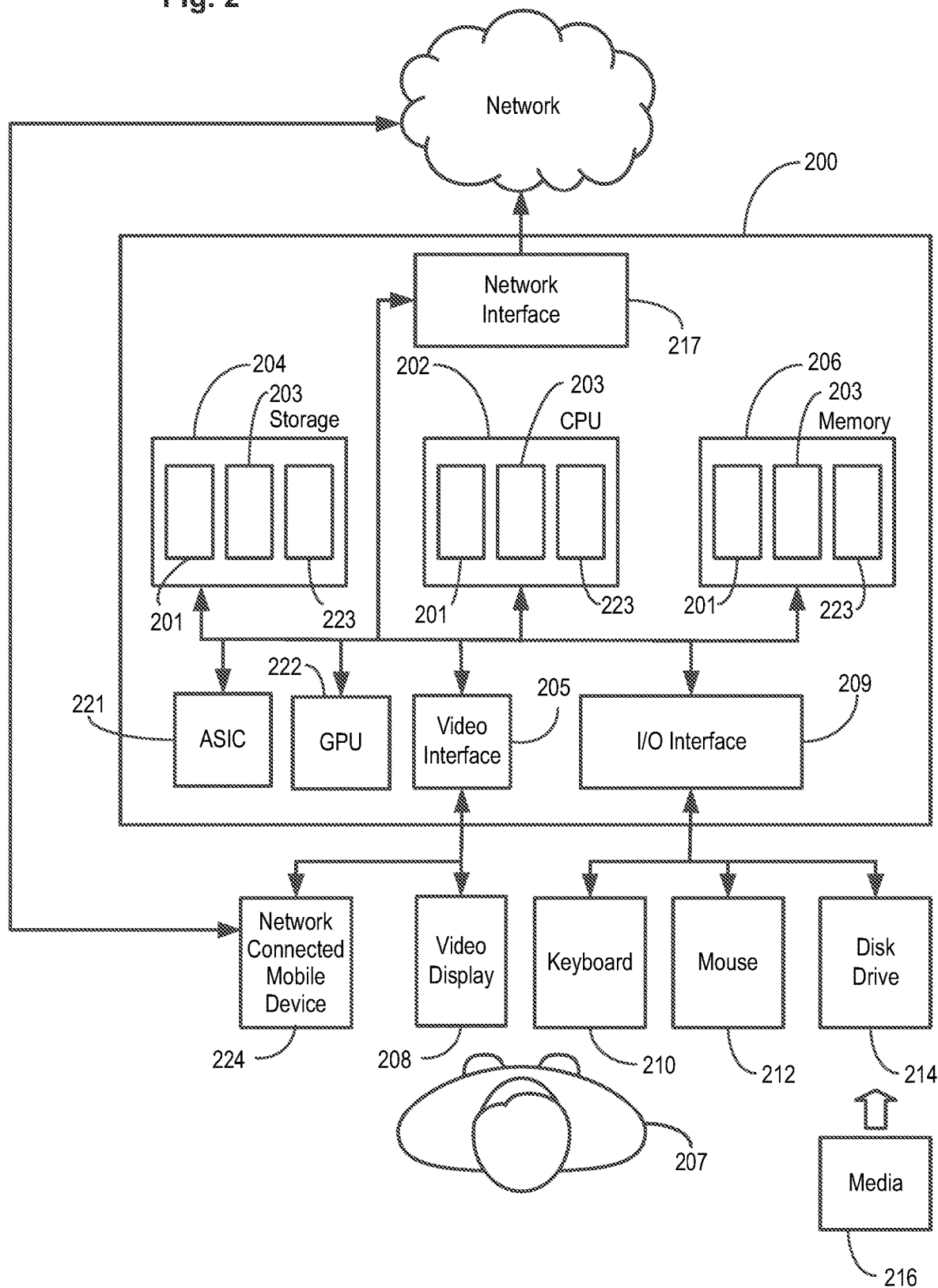
FIG. 2 shows a schematic block diagram of a computer which may provide an operating environment in accordance with various embodiments.

In another embodiment, the system Control is operatively connected to or embodied within a computer device 123, such as the computer device shown in FIG. 2.

As shown in FIG. 2, a suitably configured computer device, and associated communications networks, devices, software and firmware may provide a platform for enabling one or more embodiments as described above. By way of example, FIG. 2 shows a computer device 200 that may include a central processing unit ("CPU") 202 connected to a storage unit 204 and to a random access memory 206. The CPU 202 may process an operating system 201, application program 203, and data 223. The operating system 201, application program 203, and data 223 may be stored in storage unit 204 and loaded into memory 206, as may be required. Computer device 200 may further include an Application Specific Integrated Circuit (ASIC) 221 and/or a graphics processing unit (GPU) 222 which is operatively connected to CPU 202 and to memory 206 to offload intensive processing calculations from CPU 202 and run these calculations in parallel with CPU 202. The ASIC 221 functions in a similar way to the GPU.

In an embodiment, the storage unit 204 may be a write once read many (WORM) storage unit where the operating system 201, application program 203, or data 223 may be stored as digital records on a blockchain. A blockchain is a growing ledger of digital records, called blocks, which are hashed and linked using cryptography to form a data chain. Access to the blockchain may be public, or permissioned for access by certain classes of users. New records are added to the collective record using a predetermined set of rules called a protocol. Once recorded, the data in any given block cannot be altered retroactively without alteration of all subsequent blocks or changing the protocol. Data 223 may be read from and written to a blockchain. Data 223 may be updated however updated data cannot be modified or overwrite old data.

In an embodiment, the storage unit 204 may be a virtual storage unit where the operating system 201, application program 203 may be loaded into memory from a publicly accessible blockchain via a network. Data 223 generated by the computer 200 may be written to a blockchain.

In an embodiment, the blockchain may be public, or permissioned to allow access to authorized parties or classes of users, and may be utilized to store performance or utilization data, as well as recording the execution of any transactions between the parties. The blockchain may also be utilized to establish and execute smart contracts as between the parties, including the data processing unit end users and the data processing unit manager, and as between the heated appliance users and the data processing unit manager. In an embodiment, the operating frequency of the ASIC, CPU or GPU calculations can be over clocked or underclocked to coincide with demand for heating or demand for data processing.

In an embodiment, an operator 207 may interact with the computer device 200 using a video display 208 connected by a video interface 205, and various input/output devices such as a keyboard 210, pointer 212, a network connected mobile device 224 and storage 214 connected by an I/O interface 209. In known manner, the network connected mobile device 224 or the pointer 212 may be configured to control an application on a video display 208, and to operate various graphical user interface (GUI) controls appearing in the video display 208. The computer device 200 may form part of a network via a network interface 217, allowing the computer device 200 to communicate with other suitably configured data processing systems or circuits. A non-transitory medium 216 may be used to store executable code embodying one or more embodiments of the present method on the computing device 200.

In an embodiment, an operator 207 may access energy use and temperature data from the co-located ICs heat source and the appliances having a need for a heating energy such as a hot water tank, from a network connected mobile device 224.

The computer device 200 may also be remotely controlled via the network interface 217, such that it is not necessary to have any operator 207 present locally. A network of such computer devices 200 may be controlled remotely, such that a plurality of such devices may be a part of the system.

In an embodiment, the Control Module as embodied on a computer device 200, executes a control algorithm which receives the inputs from a combination of the temperature and flow sensors 108, 109, 114 and 118 and the pumps 110 and 115, and processes those inputs to achieve a desired balance between temperature within the PCB enclosure 102, and the temperature of the appliance 112. As noted above, the system is able to directly control the pump 115 or both pumps 115 and 110, as well as the power supply 103.

In an embodiment, the Control Module algorithm as executed on computer device 200 is adapted to achieve optimal utilization of the waste heat from the ICs by regulating the transfer of heat energy utilizing the cooling fluids in each of the fluid circuits.

In an embodiment, the integrated circuits within the computer device 200 are contained within the PCB enclosure 102, such that the circuits running the Control Module are being cooled by the system. The system is thus also configured as a self-cooling computer device.

In an embodiment, the Control Module is adapted to be connected via a network to a plurality of like systems, which allows the Control Module to operate as a node within a network of similar nodes. As an example, the ICs shown within FIG. 1 may be one computer node within a distributed computing network, which allows data processing to be balanced across many processors within the network.

FIGS. 3-7 show schematic block diagrams of various configurations of IC fluid cooling systems.

Figure 3:
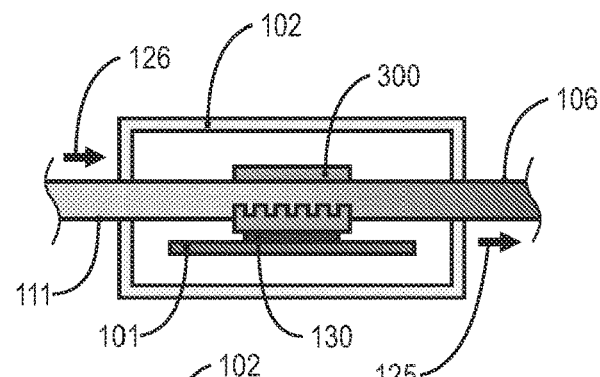
FIG. 3 shows a schematic block diagram of an IC mounted to a PCB and a heat sink that is cooled by a fluid circuit.

FIG. 3 shows a schematic block diagram of an IC 130 mounted to a PCB 101 and a cooling block 300 that is cooled by a fluid circuit. This is a typical cooling block for a water cooled CPU.

Figure 4:
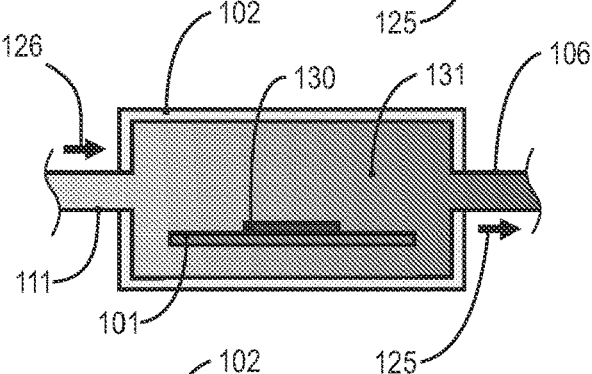
FIG. 4 shows a schematic block diagram of an IC mounted to a PCB, in which the IC is cooled by immersing it in a dielectric fluid that dissipates the heat.

FIG. 4 shows a schematic block diagram of an IC 130 mounted to a PCB 101 in an enclosure 102 operatively connected to a coolant pipe 106 and 111. The IC is cooled by immersing it in a dielectric fluid circuit 131 that dissipates the heat.

Figure 5:
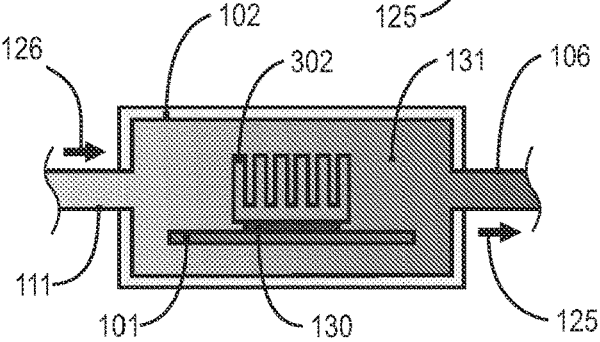
FIG. 5 shows a schematic block diagram of an IC mounted to a PCB and a heat sink that is cooled by immersing it in a dielectric fluid that dissipates the heat.

FIG. 5 shows a schematic block diagram of an IC 130 mounted to a PCB 101 and a heat sink 302 that is mounted to the IC 130 in an enclosure 102 operatively connected to a coolant pipe 106 and 111. Heat generated by the IC is dissipated through the heatsink and cooled by immersing it in a dielectric fluid circuit 131.

Figure 6:
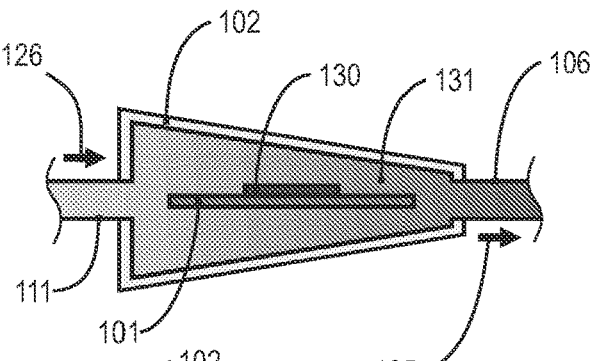
FIG. 6 shows a schematic block diagram of an IC mounted to a PCB that is cooled by immersing it in a dielectric fluid.

FIG. 6 in a similar manner to FIG. 4 shows a schematic block diagram of an IC 130 mounted to a PCB 101 that is cooled by immersing it in a dielectric fluid circuit. The flow mass of the coolant is constant; however, the flow rate is accelerated by reducing the aperture through which the liquid flows, in order to improve its ability to absorb heat as the temperature gradient decreases while the cooling fluid is heated.

Figure 7:
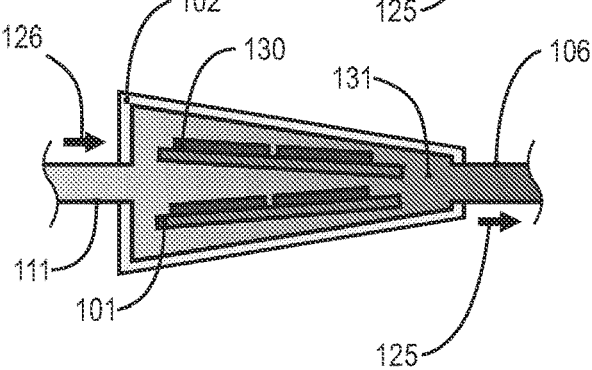
FIG. 7 shows a schematic block diagram of multiple PCB's arranged in the same configuration as FIG. 6.

FIG. 7 is the same as FIG. 6, only it shows multiple PCBs arranged in the same configuration.

The configurations shown in FIGS. 4-7 can minimize energy loss to entropy when the PCB enclosure is well insulated.

Figure 8:
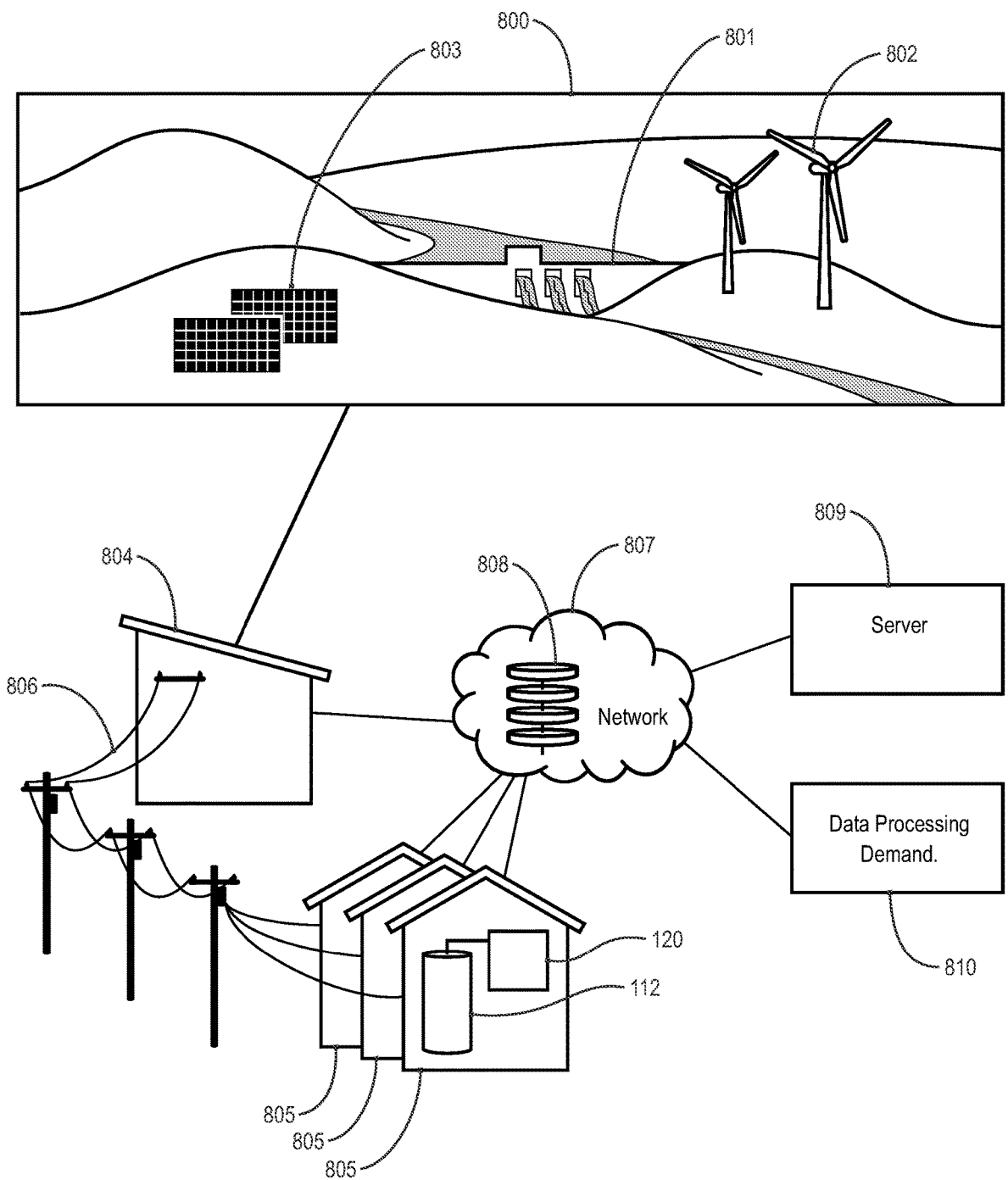
FIG. 8 shows a schematic block diagram of the system in accordance with an illustrative embodiment in relation to an electricity distribution network.

As shown in FIG. 8 the system as illustrated in FIG. 1 is a self-contained system in an insulated enclosure or box 120 that is co-located with a heated appliance such as a hot water tank 112 located within consumers' premises 805 connected to a network 807 and an electricity grid 806.

In an embodiment, the network 807 is operatively connected to a distributed public or permissioned blockchain infrastructure 808.

Still referring to FIG. 8 in a known manner electricity generation 800 can be generated from renewable sources of potential energy such as a hydroelectric dam 801, wind turbines 802 and directly from solar energy 803. In a known manner a power utility provider 804 may resell electricity via an electric grid 806 to consumer 805. The utility provider 804 may have an irregular supply of electricity from variable methods of electricity generation 800 that does not match electricity supply with consumer demand.

In an embodiment the power utility provider 804 may communicate over the network 807 or both a network 807 and a blockchain 808 infrastructure or both a network 807 and a server 809 to share data pertaining to electricity supply and demand. A plurality of like systems, as described within FIG. 1 located with consumers 805 may cooperate over the network to better balance electricity supply and demand with the demand for heat in connected appliances with an additional demand for data processing 810.

In an embodiment the power utility provider 804 may communicate over the network 807 or both a network 807 and a blockchain infrastructure 808 and access data from a plurality of like systems, as described within FIG. 1 or access data from a server 809. The power utility provider 804 may assess the collective energy demand for heat from connected consumers 805 to better balance available electricity supply and demand.

Use Case

In an embodiment, the system may be utilized for performing calculations and storing data within a blockchain infrastructure, as described above.

In the context of writing data to a blockchain, a CPU cost function known as Proof of Work is required. Proof of Work or "PoW" is a CPU cost function used to reach a common consensus on valid data written to the blockchain. Typically such server networks are housed in large data centers.

As an illustrative example, the present system and method can be used for PoW, and storing and sharing blockchain data.

In an embodiment of the present system and method, each computer device 200 may be one node in a distributed heating and computing system. Each node may be controlled by a server to balance pooled resources with other nodes performing a CPU cost function in Proof of Work consensus protocol. In addition, the computer can be a partial blockchain node within a distributed computing network, which may partially store and serve data balanced across many devices within the network.

The server may be communicatively coupled to each computing/heating subsystem to receive an indication of a local heating demand and output a workload to each computing device. Thus for a given heated appliance the appropriate amount of heat is provided in proportion to the workload of respective fluid coupled computing device.

The server may be programmed to anticipate a future heating demand for each of the appliances and then assign or increase the workload for the connected computing device to coincide with the anticipated heating demand. The workload of a given node may be increased by increasing the clock rate and/or instructing it to work on a PoW function in a distributed consensus blockchain.

This server may use machine learning or trend analysis based on historical data to anticipate appliances' heating demands and schedules.

Advantageously, the present system and method provides a technological solution for the more efficient utilization of waste energy by reusing as much heat energy from ICs as possible. By co-locating a self-contained system within an enclosed unit with a heated appliances, the present method allows waste energy from ICs to be utilized to provide heat to heated appliances such as hot water tanks. In effect, the energy is used twice—once to operate the ICs, and again to heat an appliance, such as a hot water tank—thus significantly increasing the efficiency of energy utilization.

Renewable energy from irregular phenomena such as tides, sunlight free from cloud cover, rainfall, and wind that do not coincide with the typical electricity demand cycles pose an energy storage problem. The present system and method provides a technological solution for better managing electricity to do work where the heat can be stored for later use to balancing irregular supply and demand for electricity.

In addition, as water heaters are being directly monitored by the system, aggregate data for hot water usage can be collected for a given geographic area for aggregate planning purposes. For example hot water energy usage can be optimized to mitigate peak energy demand on an electric grid.

The disclosed method described a system to maintain an optimal IC temperature, by transferring heat at a constant rate away from an IC to be used to heat an appliance by the method previously described, where there is a diminishing or changing temperature gradient. In addition the disclosed method differs with consideration to:

The asynchronous coincidence with the demand for heat and computing can be managed by distributing computational load over the network of computers that can disconnect and rejoin the network at will. Work can be assigned to a location or device where the heat will be required in the future. By utilizing an appliance like a hot water tank as a heat sink for absorbing reject energy from a managed work load using ICs, demand for heat may also be managed by using hot water tanks as a thermal heat battery.

The asynchronous demand for computing and heat can be managed to meet both computing demand and ensure heat is available when it is used, by generating heat, to be stored, to coincide with statistical heat demand.

In addition the system may be configured so that the work load performed by the ICs are performed at the optimal frequency maximizing work efficiency when measured in watts per clock cycle, (frequency) and run with a consistent workload, mitigating the need to increase the workload at a less efficient clock cycle to generate heat.

Thus, in an aspect, there is provided a system for transferring heat from integrated circuits, comprising: integrated circuits enclosed by an enclosure; a heat exchanger; a first fluid circuit in a closed loop with the enclosure and heat exchanger for cooling a first fluid in contact with the integrated circuits; a second fluid circuit loop connected to the heat exchanger for heating a second fluid in the second fluid circuit; a temperature sensor for measuring a temperature in the first fluid circuit or second fluid circuit or integrated circuit; fluid flow control means in the second fluid circuit; and a control module operatively connected to receive temperature data from the temperature sensor and generating control signals to the fluid flow control means to regulate the temperature in the first and second fluid circuit.

In an embodiment, the system further comprises a second temperature sensor coupled to the second fluid circuit for measuring a second temperature, and wherein the control module further generates control signals to regulate the second temperature.

In another embodiment, the second fluid circuit is connectable to a heated appliance, preferably a water tank.

In another embodiment, the system further comprises a plurality of said enclosures, fluid circuits and integrated circuits, each connected to respective heated appliances, as nodes in a distributed computing and heating network.

In another embodiment, the system further comprises a central processor in communication with each of the plural integrated circuits and programmed to receive an indication of a local heating demand and determine a workload for each of the plural integrated circuits.

In another embodiment, the system further comprises varying a computational workload on the ICs to meet a demand or anticipated demand for heating the second fluid.

In another embodiment, the fluid control means comprises a pump or valve.

In another embodiment, the flow rate of the first fluid is accelerated by narrowing the enclosure in the first fluid circuit for cooling the integrated circuits in contact with the first fluid.

In another embodiment, the first fluid's flow rate is accelerated by narrowing the enclosure in the first fluid circuit and multiple printed circuit boards are arranged in a tapered manner for cooling the integrated circuits in contact with the first fluid.

In another aspect, there is provided a method of installing a heat transfer system comprising the steps: enclosing Integrated circuits within an enclosure filled with a first fluid; connecting a first fluid circuit in a closed loop with the enclosure and with a heat exchanger for cooling the first fluid; connecting a second fluid circuit in in a closed loop with the heat exchanger and a heated appliance; connecting a temperature sensor to measure a first temperature in the first fluid circuit or second fluid circuit or integrated circuit; connecting a fluid flow control means to the second fluid circuit; and connecting a control module to the temperature sensor and the fluid flow control means, which control module is adapted to generate control signals to the fluid flow control means to regulate the temperature in the first and second fluid circuit.

In an embodiment, the method further comprises connecting a second temperature sensor coupled to the second fluid circuit for measuring a second temperature, and wherein the control module is further adapted to receive a signal from the second temperature sensor and generate control signals to regulate the second temperature.

In another embodiment, the second fluid circuit is further connected to a fresh water supply and wherein the heated appliance is a water tank.

In another embodiment, the fluid control means comprises a pump or valve.

In another embodiment, the method further comprises connecting the integrated circuits in communication with a distributed computing network.

In another embodiment, the method further comprises repeating the connections of fluid circuits, temperature sensors, control module, and integrated circuits to create plural heat transfer systems, each system connected to respective heated appliances, as nodes in a distributed computing and heating network.

In another embodiment, the method further comprises connecting each of the plural integrated circuits in communication with a central processor.

In another embodiment, there is provided a distributed data processing network, comprising: a plurality of data processing units, each data processing unit operatively connected to a heated appliance, and including: integrated circuits enclosed by an enclosure; a heat exchanger; a first fluid circuit in a closed loop with the enclosure and heat exchanger for cooling a first fluid in contact with the integrated circuits; a second fluid circuit loop connected to the heat exchanger for heating a second fluid in the second fluid circuit; a temperature sensor for measuring a temperature in the first fluid circuit or second fluid circuit or integrated circuit; fluid flow control means in the second fluid circuit; and a control module operatively connected to receive temperature data from the temperature sensor and generating control signals to the fluid flow control means to regulate the temperature in the first and second fluid circuit; wherein, the plurality of data processing units are operatively connected to a remote management server adapted to control data processing on the data processing units based on received demand from the heated appliances, and the data processing workloads from data processing end users accessing the distributed data processing units.

In an embodiment, the data processing units are operatively interconnected to a power utility via a communication network, and adapted to communicate forecast demands for electricity based on heating requirements for the heated appliance and data processing end user utilization of the data processing units.

In another embodiment, the data processing units are controllable from the remote management server to manage demand for the heated appliance with demand for data processing resources from data processing end users.

In another embodiment, the data processing units are controllable from the remote management server to optimize energy costs by offering data processing resources to data processing end users at different rates, in dependence upon optimal energy pricing from the power utility in dependence upon the demand for heating the heated appliance.

In another embodiment, data generated by the data processing units are stored to a public blockchain infrastructure, and the public blockchain infrastructure is utilized by the power utility and the data processing end users to manage energy demand and data processing efficiency, respectively.

In another embodiment, the public blockchain infrastructure is stored at least in part on the distributed data processing units, such that each data processing unit is able to optimize water heating demand and data processing demand at micro and macro levels.

In another embodiment, the system is adapted to monitor and report temperature and usage data for the data processing units and the heated appliances.

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

While illustrative embodiments have been described above by way of example, it will be appreciated that various changes and modifications may be made without departing from the scope of the invention, which is defined by the following claims.

The invention claimed is:

1. A system for transferring recycling waste heat from integrated circuits, comprising:
    an enclosure containing the integrated circuits and a first cooling liquid;
    a heat exchanger;
    a first fluid circuit in a closed loop with the enclosure and the heat exchanger, wherein the first cooling liquid is circulated through the first fluid circuit to cool the first cooling liquid as it circulates through the heat exchanger and dissipates waste heat from the integrated circuits;
    a second fluid circuit connected to the heat exchanger and a heated appliance, wherein a second liquid is circulated through the second fluid circuit and passes through the heat exchanger, wherein waste heat dissipated from the integrated circuits by the first liquid is transferred to the second liquid circulating through the heat exchanger to the heated appliance;
    a temperature sensor in the second fluid circuit for measuring a temperature in the second fluid circuit;
    a fluid flow control means in the second circuit; and
    a control module operatively connected to receive temperature data from the temperature sensor in the second fluid circuit and generating control signals to the fluid flow control means in the second circuit to adjust the flow rate of the second liquid to obtain a desired heat transfer rate to deliver a regulated temperature to the appliance and the integrated circuits.

2. The system of claim 1, wherein the heated appliance is a water tank.

3. The system of claim 1, wherein the system comprises a plurality of said enclosures, fluid circuits and integrated circuits, each connected to respective heated appliances, as nodes in a distributed computing and heating network.

4. The system of claim 3, further comprising a central processor in communication with each of the plural integrated circuits and programmed to receive an indication of a local heating demand and determine a workload for each of the plural integrated circuits.

5. The system of claim 1, further comprising varying a computational workload on the integrated circuits to meet a demand or anticipated demand for heating the second liquid.

6. The system of claim 1, wherein the fluid control means comprises a pump or valve.

7. The system of claim 1, wherein the flow rate of the first liquid is accelerated by narrowing the enclosure in the first fluid circuit for cooling the integrated circuits in contact with the first-fluid liquid.

8. The system of claim 1, wherein the first liquid's flow rate is accelerated by narrowing the enclosure in the first fluid circuit and multiple printed circuit boards are arranged in a tapered manner for cooling the integrated circuits in contact with the first liquid.

9. A method of recycling waste heat from integrated circuits for utilization in a heated appliance using the system according to claim 1, the method comprising absorbing waste heat from the integrated circuits by the first cooling liquid. wherein the integrated circuits have a predetermined energy workload; and transferring the waste heat from the first cooling liquid to the second liquid during circulation through the heat exchanger, and wherein the waste heat transferred to the second liquid is utilized by the heated appliance, and wherein a regulated temperature is delivered to the heated appliance and the integrated circuits by controlling the fluid flow control means in the second circuit to adjust the flow rate of the second liquid to obtain a desired heat transfer rate calculated based on temperature data from the temperature sensor and the predetermined energy workload of the integrated circuits.

10. The method of claim 9, further comprising connecting the second fluid circuit to a fresh water supply and wherein the heated appliance is a water tank.

11. The method of claim 9, wherein the integrated circuits are in communication with a distributed computing network.

12. The method of claim 9, further comprising repeating connections of fluid circuits, temperature sensors, control module, and integrated circuits to create plural heat transfer systems, each system connected to respective heated appliances, as nodes in a distributed computing and heating network.

13. The method of claim 12, further comprising establishing a connection between each of the plural integrated circuits and a central processor.

14. A distributed data processing network, comprising:
    a plurality of data processing units, each data processing unit operatively connected to a heated appliance, and including:
    integrated circuits in fluid connection with a first cooling liquid enclosed by an enclosure, wherein the integrated circuits have a predetermined energy workload;
    a heat exchanger having fluid circuits for cooling the integrated circuits with fluid flow, wherein the fluid circuits comprise:

a first fluid circuit in a closed loop with the enclosure and the heat exchanger, wherein the first cooling liquid is circulated through the first fluid circuit to cool the first cooling liquid as it circulates through the heat exchanger and dissipates waste heat from the integrated circuits;

a second fluid circuit connected to the heat exchanger and a heated appliance, wherein a second liquid is circulated through the second fluid circuit and passes through the heat exchanger, wherein waste heat dissipated from the integrated circuits by the first liquid is transferred to the second liquid circulating through the heat exchanger to the heated appliance;

a temperature sensor for measuring a temperature of the second liquid in the second fluid circuit; and a fluid flow control means in the second circuit; and a control module operatively connected to receive temperature data from the temperature sensor in the second fluid circuit and the predetermined energy workload data of the integrated circuits to generate control signals to the fluid flow control means in the second circuit to adjust the fluid flow rate of the second liquid to obtain a desired heat transfer rate to deliver a regulated temperature to the appliance and the integrated circuits;

wherein, the plurality of data processing units are operatively connected to a remote management server adapted to control data processing on the data processing units based on received demand from the heated appliances, and the data processing workloads from data processing end users accessing the distributed data processing units.

15. The distributed data processing network of claim 14, wherein the data processing units are operatively interconnected to a power utility via a communication network, and adapted to communicate forecast demands for electricity based on heating requirements for the heated appliance and data processing end user utilization of the data processing units.

16. The distributed data processing network of claim 15, wherein the data processing units are controllable from the remote management server to manage demand for the heated appliance with demand for data processing resources from data processing end users.

17. The distributed data processing network of claim 16, wherein the data processing units are controllable from the remote management server to optimize energy costs by offering data processing resources to data processing end users at different rates, in dependence upon optimal energy pricing from the power utility in dependence upon the demand for heating the heated appliance.

18. The distributed data processing network of claim 17, wherein data generated by the data processing units are stored to a public blockchain infrastructure, and the public blockchain infrastructure is utilized by the power utility and the data processing end users to manage energy demand and data processing efficiency, respectively.

19. The distributed data processing network of claim 18, wherein the public blockchain infrastructure is stored at least in part on the distributed data processing units, such that each data processing unit is able to optimize water heating demand and data processing demand at micro and macro levels.

20. The distributed data processing network of claim 18, wherein the system is adapted to monitor and report temperature and usage data for the data processing units and the heated appliances.

21. The system of claim 1, wherein the heat exchanger has a top and a bottom portion and wherein the first fluid circuit comprises a coolant pipe connecting the enclosure to the top of the heat exchanger and an exchange pump connected to the bottom of the heat exchanger, wherein the coolant pipe is located above the heat exchanger and the exchange pump is located below the heat exchanger.

22. The distributed data processing network of claim 14, wherein the heat exchanger has a top and a bottom portion and wherein the first fluid circuit comprises a coolant pipe connecting the enclosure to the top of the heat exchanger and an exchange pump connected to the bottom of the heat exchanger, wherein the coolant pipe is located above the heat exchanger and the exchange pump is located below the heat exchanger.

* * * * *

UNITED STATES PATENT AND TRADEMARK OFFICE
CERTIFICATE OF CORRECTION

PATENT NO. : 11,744,039 B2
APPLICATION NO. : 17/462815
DATED : August 29, 2023
INVENTOR(S) : Adrian Albert van Wijk et al.

Page 1 of 1

It is certified that error appears in the above-identified patent and that said Letters Patent is hereby corrected as shown below:

In the Claims

Column 14, Claim 7, Line 22:
"the first-fluid liquid." should read: --the first liquid.--.

Column 14, Claim 9, Line 32:
"liquid. wherein" should read: --liquid wherein--.

Signed and Sealed this
Twenty-fifth Day of March, 2025

Coke Morgan Stewart
*Acting Director of the United States Patent and Trademark Office*